(12) United States Patent
Hao et al.

(10) Patent No.: US 6,358,825 B1
(45) Date of Patent: Mar. 19, 2002

(54) PROCESS FOR CONTROLLING LIFETIME IN A P-I-N DIODE AND FOR FORMING DIODE WITH IMPROVED LIFETIME CONTROL

(75) Inventors: Jifa Hao, Mountaintop; Randall L. Case, Mansfield; John L. Benjamin, Mountaintop, all of PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/718,219

(22) Filed: Nov. 21, 2000

(51) Int. Cl.[7] ..................... H01L 21/22; H01L 21/332
(52) U.S. Cl. ........................... 438/543; 438/137
(58) Field of Search ........................ 438/237, 136, 438/543

(56) References Cited

U.S. PATENT DOCUMENTS

| | | | |
|---|---|---|---|
| 4,689,645 A | * 8/1987 | Ovshinsky et al. | 257/70 |
| 4,925,812 A | 5/1990 | Gould | |
| 5,262,336 A | * 11/1993 | Pike, Jr. et al. | 437/31 |
| 5,283,202 A | * 2/1994 | Pike, Jr. et al. | 437/31 |
| 5,468,660 A | * 11/1995 | Frisina et al. | 437/31 |

OTHER PUBLICATIONS

Baliga, B.J., "Chapter 2: Transport Physics", *Power Semiconductor Devices*, 1996, PWS Publishing Co., Boston MA, pp 55–59.

Lisiak, K.P., et al., "Energy Levels and Concentrations For Platinum in Silicon", *Solid–State Electronics*, 1975, vol. 18, pp. 533–540.

* cited by examiner

*Primary Examiner*—David Nelms
*Assistant Examiner*—Thao P. Le
(74) *Attorney, Agent, or Firm*—Jaeckle Fleischmann & Mugel, LLP

(57) ABSTRACT

In an improved process for controlling and improving minority carrier lifetime in a P-i-N diode, platinum is deposited on a surface of a silicon semiconductor substrate containing at least one PN junction. The substrate is heated to a temperature of about 800° C., and the platinum is diffused into the substrate as its temperature is increased at a rate of about 5° C./minute to a first selected temperature of about 850–950° C. Platinum diffusion is continued while the substrate is maintained at the first selected temperature for about 30–60 minutes. The substrate temperature is then increased at a rate of about 5° C./minute to a second selected temperature above 950° C. to about 1000° C., and the substrate is maintained at the second selected temperature for about 5–30 minutes before cooling.

20 Claims, 1 Drawing Sheet

PROCESS FOR CONTROLLING LIFETIME IN A P-I-N DIODE AND FOR FORMING DIODE WITH IMPROVED LIFETIME CONTROL

FIELD OF THE INVENTION

The present invention is directed to semiconductor devices and, more particularly to a process for controlling and improving lifetime in a P-i-N diode.

BACKGROUND OF THE INVENTION

P-i-N diodes are widely used for power circuit applications. Among the measures of diode performance are the following: rated forward current (IF), forward voltage drop (VF), transient forward recovery time (TFR), transient turn-on peak overshoot voltage (TOPO), diode reverse blocking, or breakdown voltage (BVR), transient reverse recovery time (TRR), and unclamped inductive switching (UIS), which is a measure of the amount of avalanche energy that can be dissipated in the device without destructive failure. TRR can be decreased by the introduction of recombination centers, but this is generally accompanied by an increase in VF.

In operation, a P-i-N diode is flooded with minority carriers during forward conduction, which results in very low resistivity of the undoped middle region, referred to as the "intrinsic" or "i" region, during current flow and allows the diode to carry a high current density. The injection of a high concentration of minority carriers during forward conduction, however, also causes adverse effects. When the P-i-N diode is turned on with a high current flow, its initial forward voltage drop exceeds the voltage drop observed for the same current level at steady state conditions, an effect that is referred to as "forward voltage overshoot."

A second, more serious drawback of a P-i-N diode has to do with its reverse recovery, as measured by TRR When the diode is switched from its on-state to its off-state, the minority carrier charge stored in the i-region of the diode during forward conduction must be removed by a large reverse current, followed by recombination. This reverse current surge is accompanied by a large voltage overshoot that results from flow of the reverse current through inductances in the circuit.

Increasing the switching frequency of a power circuit requires an increase in both turn-off speed and reverse current flow of the circuit components, leading to a degradation in system frequency. The operation and characteristics of P-i-N diodes are discussed in B. J. Baliga, *Power Semiconductor Devices,* 1996, PWS Publishing Company, Boston Mass., pages 153–182, the disclosure of which is incorporated herein by reference.

The current density of a P-i-N diode in its on-state is determined by recombination of minority carriers in its i region. Therefore faster reverse recovery, i.e., the process of switching the diode from its on- to its off-state, can be achieved through the introduction of recombination centers into its middle region by, for example, diffusion of gold or platinum, or by high energy electron irradiation. As discussed in the aforementioned work of Baliga at pages 55–59, the disclosure of which is incorporated herein by reference, the thermal diffusion of an impurity that exhibits deep levels in the energy gap of silicon, platinum, for example, is a commonly employed method for controlling lifetime in a power device.

U.S. Pat. No. 4,925,812, the disclosure of which is incorporated herein by reference, describes a process for introducing platinum atoms into a semiconductor body to reduce minority carrier lifetime that comprises the steps of forming layers first of palladium and then of platinum on a surface of the body, heating the body to form a layer of palladium silicide containing dissolved platinum atoms, and then heating the body to a temperature to allow platinum but not palladium atoms to diffuse into the body.

U.S. Pat. No. 5,283,202, the disclosure of which is incorporated herein by reference, describes a process for making a semiconductor power device with improved minority carrier lifetime control wherein a maximum dose of a transition metal, platinum or gold, is deposited on a surface of the device substrate adjacent a PN junction and metal atoms are diffused throughout the substrate in a gradient profile relative to the substrate surface.

Platinum diffuses into silicon much more rapidly than do atoms of boron or phosphorus, typical dopants for forming a diode. The diffusion of platinum into the device is carried out following its formation but prior to its metallization by, for example, aluminum. Platinum diffusion temperatures typically lie between about 850° C. and 1000° C.; at such temperatures, even small variations, as little as 5° C., can produce large variations in the performance of a P-i-N diode. When the temperature of a substrate during platinum implantation diffusion is ramped up from, for example, 800° C. to a target of 960° C. over a period of about 30 minutes, a temperature overshoot of as much as 10° C. can occur, requiring 10–15 minutes for the temperature to fall back to its intended level. Such an occurrence can have serious adverse consequences for the characteristics and performance of the diode. Furthermore, the process results, not in a desirable concentration of diffused platinum near the PN junction but in a substantially uniform platinum distribution throughout the substrate.

Thus, there continues to be a need for a method of reliably controlling and improving the lifetime characteristics of a P-i-N diode, including switching speed, forward voltage drop, and current leakage. The present invention meets this need.

SUMMARY OF THE INVENTION

The present invention is directed to an improved process for controlling and improving minority carrier lifetime in a P-i-N diode that comprises depositing platinum on a surface of a silicon semiconductor substrate containing at least one PN junction, heating the substrate to a temperature of about 800° C., and diffusing the platinum into the substrate while increasing its temperature at a rate of about 5° C./minute to a first selected temperature of about 850–950° C. Platinum diffusion is continued while maintaining the substrate at the first selected temperature for about 30–60 minutes, then increasing the substrate temperature at a rate of about 5° C./minute to a second selected temperature above 950° C. to about 1000° C., and maintaining the substrate at the second selected temperature for about 5–30 minutes before cooling.

The present invention is further directed to the formation of a P-i-N diode having improved minority carrier lifetime control.

DETAILED DESCRIPTION OF THE INVENTION

Figure 1:
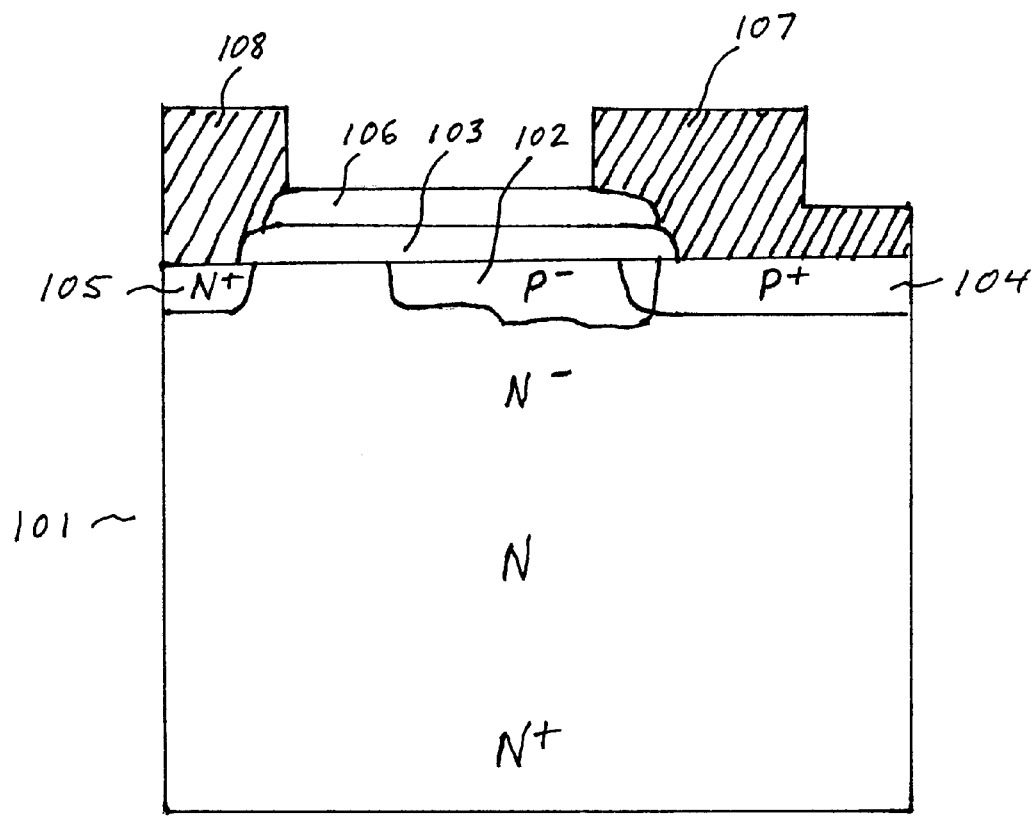
FIG. 1 schematically depicts a P-i-N diode formed by the process of the present invention.

In accordance with the present invention, platinum is deposited on a silicon semiconductor substrate containing at least one PN junction using, for example, a CHA evaporation chamber. A platinum layer having a thickness of about 5 angstroms to about 100 angstroms can be formed on either the front or the rear surface of the substrate. Preferably, the surface of the substrate is ion-milled in the evaporation chamber to remove native oxide prior to deposition of the platinum.

The substrate is heated to a temperature of about 800° C. using, for example, a commercial furnace intended for controlled semiconductor diffusion, and the platinum is diffused as the temperature is increased at a rate of about 5° C./minute to a first selected temperature of about 850–950° C. and maintained at that temperature for about 30–60 minutes. Platinum diffusion is continued as the substrate temperature is increased to a second selected temperature above 950° C. to about 1000° C. at a rate of about 5° C./minute and maintained at that temperature for about 5–30 minutes. The amount of platinum diffused into the substrate is sufficient to effect minority carrier lifetime control without substantially increasing leakage current in the device.

In a preferred embodiment of the process of the invention, the substrate is heated to a first selected temperature of about 940° C., where it is held for about 40 minutes, then heated to a second selected temperature of about 980° C., where it is held for about 15 minutes. The substrate is then cooled, preferably gradually, to about 600° C. at a rate of about 3° C./minute. The substrate is optionally held at that temperature for about 1 to 2 hours before cooling to the ambient. Slow cooling of the substrate is beneficial for reducing reverse leakage current (IR).

In a test illustrating the benefits of the present invention, a comparison wafer ("Control" wafer) and a wafer of the invention ("Test" wafer) having the same structure and formed from the same lot of epitaxially grown silicon differ only in the process employed for the diffusion of platinum that had been deposited on the rear surface. The Control wafer, first heated to 800° C., was then heated to a target of 960° C. at a rate of about 5° C./min. Overshooting of the target temperature by about 10° C. was observed, about 10 minutes being required for stabilization to 960° C. After a total diffusion time of 60 minutes as measured from the 800° C. starting point, the Control wafer was allowed to cool gradually to 600° C. at a rate of about 3° C./min before further cooling to the ambient.

The Test wafer, first heated to 800° C., was then heated to a target of 940° C. at a rate of about 5° C./min. The Test wafer was held at 940° C. for 40 minutes, then heated at 5° C./min to a temperature of 980° C. and held at that temperature for 15 minutes. The Test wafer was then allowed to cool gradually to 600° C. at a rate of about 3° C./min before further cooling to the ambient.

Measurements of reverse recovery time (TRR), forward voltage (VF), and breakdown voltage (BVR) were made on each of the nominally 200-volt diode dies comprising the Control and Test wafers. In the Control wafer, 90.75% of the dies met performance specifications. By comparison, 97.13% of the dies in the Test wafer met the specifications. The much higher yield of dies meeting specifications in the Test wafer versus the Control wafer demonstrates the substantial improvement in process control provided by the present invention.

The diode dies from the Control and Test wafers that had met performance specifications were each assembled in a device package, on which measurements of reverse recovery time (TRR), forward voltage (VF), and breakdown voltage (BVR) were made. TABLE 1 below contains the results of these measurements:

TABLE 1

| Device Package | TRR | VF @ 15A | BVR |
| --- | --- | --- | --- |
| Control | 27 ± 2 ns | 901.6 ± 3.40 mV | 265.8 ± 8.48 V |
| Test | 25 ± 1 ns | 891.6 ± 2.73 mV | 264.7 ± 3.70 V |

As shown by the data in TABLE 1, relative to the Control device package, the TRR of the Test device package was reduced by about 8 percent, and its VF was lowered by about 1 percent, indicating an enhancement of the platinum atom concentration in the vicinity of the PN junction. For both devices, the leakage current (IR) was less than 50 nA @ 200 V, exceeding the published specification of 100 nA @ 200 V. Thus, the process of the present invention is advantageous both for significantly improving the die yield and for enhancing the performance of dies meeting specifications when they are subsequently incorporated into device packages.

FIG. 1 is a schematic representation of an example of a P-i-N diode 100 formed by the process of the present invention in an N-doped epitaxially grown silicon wafer 101. For higher voltage diodes, i.e., approximately 600 volts, a P⁻ doped region 102, which provides improved BVR characteristics, is formed by boron implantation and diffusion into the front surface of wafer 101. In the case of lower voltage diodes, i.e., about 200 volts, the formation of region 102 may be omitted.

An oxide dielectric layer 103 is formed over region 102, and a P⁺ doped region 104 is formed by a second masked implantation and diffusion of boron. An N⁺ doped region 105 is formed by implantation and diffusion of phosphorus into the front surface of wafer 101. A glass dielectric layer 106 is optionally formed over oxide layer 103, and platinum is deposited on and diffused into either the front or rear side of wafer 101 in accordance with the process of the invention. A metal layer is deposited and patterned to form contacts 107 and 108 with, respectively, P⁺ doped region 104 and N⁺ doped region 105.

The process of the present invention provides several substantial advantages in the characteristics and performance of a P-i-N diode: a higher concentration of platinum atoms in the vicinity of the PN junction relative to elsewhere in the substrate, a reduction in forward voltage drop (VF), a decrease in reverse recovery time (TRR), a tighter distribution of TRR and VF, and improved reproducibility.

The invention has been described in detail for the purpose of illustration, but it is to be understood that such detail is solely for that purpose, and variations can be made therein by those skilled in the art without departing from the spirit and scope of the invention, which is defined by the claims that follow.

What is claimed is:

1. In a process for controlling and improving minority carrier lifetime characteristics in a P-i-N diode, the improvement comprising:

depositing platinum on a surface of a silicon semiconductor substrate containing at least one PN junction;

heating said substrate to a temperature of about 800° C.;

diffusing said platinum into said substrate while increasing its temperature to a first selected temperature of about 850–950° C. at a rate of about 5° C./minute;

continuing said diffusing while maintaining said substrate at said first selected temperature for about 30–60 minutes;

continuing said diffusing while increasing the temperature of said substrate to a second selected temperature above 950° C. to about 1000° C. at a rate of about 5° C./minute;

continuing said diffusing while maintaining said substrate at said second selected temperature for about 5–30 minutes; and allowing said substrate to cool.

2. The process of claim 1 further comprising:

allowing said substrate to cool gradually to about 600° C. at a rate of about 3° C./minute.

3. The process of claim 2 further comprising:

maintaining said substrate at a temperature of about 600° C. for about 1 to 2 hours, then allowing said substrate to cool to ambient temperature.

4. The process of claim 1 wherein said first selected temperature is about 940° C., and said substrate is held at said temperature for about 40 minutes.

5. The process of claim 1 wherein said second selected temperature is about 980° C., and said substrate is held at said temperature for about 15 minutes.

6. The process of claim 1 wherein said depositing said platinum is at a front surface of said substrate.

7. The process of claim 1 wherein said depositing said platinum is at a rear surface of said substrate.

8. The process of claim 1 wherein said platinum is deposited on said substrate surface to form a layer having a thickness of about 5 angstroms to about 100 angstroms.

9. The process of claim 1 further comprising:

prior to said depositing platinum, ion-milling said surface of said substrate.

10. A P-i-N diode formed by the process of claim 1.

11. A process for forming a P-i-N diode having improved minority carrier lifetime characteristics, said improvement comprising:

depositing platinum on a surface of a silicon semiconductor substrate containing at least one PN junction;

heating said substrate to a temperature of about 800° C.;

diffusing said platinum into said substrate while increasing its temperature to a first selected temperature of about 850–950° C. at a rate of about 5° C./minute;

continuing said diffusing while maintaining said substrate at said first selected temperature for about 30–60 minutes;

continuing said diffusing while increasing the temperature of said substrate to a second selected temperature above 950° C. to about 1000° C. at a rate of about 5° C./minute;

continuing said diffusing while maintaining said substrate at said second selected temperature for about 5–30 minutes;

allowing said substrate to cool; and forming a patterned metal contact layer on a front surface of said substrate.

12. The process of claim 11 further comprising:

allowing said substrate to cool gradually to about 600° C. at a rate of about 3° C./minute.

13. The process of claim 12 further comprising:

maintaining said substrate at a temperature of about 600° C. for about 1 to 2 hours, then allowing said substrate to cool to ambient temperature.

14. The process of claim 11 wherein said first selected temperature is about 940° C., and said substrate is held at said temperature for about 40 minutes.

15. The process of claim 11 wherein said second selected temperature is about 980° C., and said substrate is held at said temperature for about 15 minutes.

16. The process of claim 11 wherein said depositing said platinum is at a front surface of said substrate.

17. The process of claim 11 wherein said depositing said platinum is at a rear surface of said substrate.

18. The process of claim 11 wherein said platinum is deposited on said substrate surface to form a layer having a thickness of about 5 angstroms to about 100 angstroms.

19. The process of claim 11 further comprising:

prior to said depositing platinum, ion-milling said surface of said substrate.

20. A P-i-N diode formed by the process of claim 11.

* * * * *